(12) United States Patent
Fratti

(10) Patent No.: US 7,248,108 B2
(45) Date of Patent: Jul. 24, 2007

(54) POWER AMPLIFIER EMPLOYING THIN FILM FERROELECTRIC PHASE SHIFT ELEMENT

(75) Inventor: Roger A. Fratti, Mohnton, PA (US)

(73) Assignee: Agere Systems Inc., Allentown, PA (US)

( * ) Notice: Subject to any disclaimer, the term of this patent is extended or adjusted under 35 U.S.C. 154(b) by 120 days.

(21) Appl. No.: 11/025,088

(22) Filed: Dec. 29, 2004

(65) Prior Publication Data

US 2006/0139091 A1 Jun. 29, 2006

(51) Int. Cl.
*H03F 3/68* (2006.01)

(52) U.S. Cl. .................................. 330/124 R; 330/295

(58) Field of Classification Search ............ None
See application file for complete search history.

(56) References Cited

U.S. PATENT DOCUMENTS

| | | | |
|---|---|---|---|
| 5,014,023 A * | 5/1991 | Mantele ..................... 333/164 |
| 6,111,462 A * | 8/2000 | Mucenieks et al. ......... 330/149 |
| 6,140,889 A * | 10/2000 | Chanteau .................... 333/131 |
| 6,329,877 B1 | 12/2001 | Bowen et al. |
| 6,356,149 B1 * | 3/2002 | Stengel et al. .............. 330/107 |
| 6,639,463 B1 * | 10/2003 | Ghanadan et al. ...... 330/124 R |
| 6,690,238 B2 * | 2/2004 | Lautzenhiser et al. ...... 330/295 |
| 6,747,517 B2 * | 6/2004 | Lautzenhiser et al. ...... 330/295 |
| 6,972,621 B2 * | 12/2005 | Matsuyoshi et al. ........ 330/149 |
| 7,053,706 B2 * | 5/2006 | Kwon et al. ............. 330/124 R |
| 7,061,314 B2 * | 6/2006 | Kwon et al. ............. 330/124 R |
| 2004/0000952 A1 * | 1/2004 | Lautzenhiser et al. ...... 330/295 |

OTHER PUBLICATIONS

B. Acikel et al., "High Performance Phase Shifters Using (Ba, Sr) TiO₃ Thin Films," NNUN Abstracts 2002, Electronics, p. 39.
C. Tongchoi et al., "Lumped Element Based Doherty Power Amplifier Topology in CMOS Process," IEEE, pp. I-445-I-448, 2003.

* cited by examiner

*Primary Examiner*—Benny T. Lee
*Assistant Examiner*—Krista M Flanagan

(57) ABSTRACT

An amplifier includes a signal splitter operable to receive an input signal and generate at least first and second split signals, a first amplifier adapted to receive the first split signal and to generate a first amplified signal, and a second amplifier adapted to receive the second split signal and to generate a second amplified signal. A combining circuit is adapted to generate an output signal which is a sum of the first amplified signal and the second amplified signal. The amplifier further includes a phase control circuit arranged in a signal path of one of the first and second amplifiers, the phase control circuit comprising at least one thin film ferroelectric element. The amount of phase shift provided by the phase control circuit is selectively variable as a function of a control signal applied thereto.

21 Claims, 3 Drawing Sheets

POWER AMPLIFIER EMPLOYING THIN FILM FERROELECTRIC PHASE SHIFT ELEMENT

FIELD OF THE INVENTION

The present invention relates generally to amplifiers, and more particularly relates to techniques for extending a usable frequency range of a power amplifier without significantly reducing linearity and/or efficiency of the amplifier.

BACKGROUND OF THE INVENTION

Due to the increasing importance of spectral efficiency in wireless communications systems, linearity and efficiency of radio frequency (RF) power amplifiers have become critical design issues, particularly for implementing complex digital modulation schemes often necessary for supporting higher data capacity and enhanced data transmission rates. Although linearity can be improved with known linearization techniques such as feed-forward linearization, this improvement comes at the expense of reduced amplifier efficiency.

Doherty amplifiers, which are well-known in the art, have been shown to achieve higher efficiencies than traditional power amplifier designs. A standard Doherty amplifier 100 is illustrated in FIG. 1. As apparent from the figure, the standard Doherty amplifier 100 consists of a carrier amplifier 102 and a peak amplifier 104 which are typically biased in class A and in class C, respectively. A quadrature 3-decibel (dB) hybrid 106 can be employed to split an input signal applied to the Doherty amplifier 100 equally, but 90 degrees out of phase, to both the carrier and peak amplifiers. Amplified output signals generated by the carrier and peak amplifiers 102, 104 are combined in phase at an output of a quarter-wave transformer 108 which is coupled to an output of the carrier amplifier.

Operation of the Doherty amplifier can be separated into two primary regions. In the first region, the input power is less than a threshold of the peak amplifier 104, and therefore only the carrier amplifier 102 supplies the output power to an output load $R_L$, connected to an output of the Doherty amplifier 100, with an efficiency determined primarily by its class A operation. As the input signal further increases to a level just below a saturation point of the carrier amplifier 102, the peak amplifier 104 begins to operate, marking the start of the second region of operation. Through the connection of the quarter-wave transformer 108, the power supplied by the peak amplifier 104 effectively reduces the apparent load impedance seen by the carrier amplifier 102. This impedance reduction enables the carrier amplifier 102 to deliver more power to the output load 110 while its voltage remains saturated. In this manner, a higher efficiency is maintained in the carrier amplifier 102, and hence the overall Doherty amplifier 100, throughout the second region until the peak amplifier 104 reaches its saturation threshold.

Although Doherty amplifiers can generally achieve higher efficiencies than traditional power amplifier designs, this increased efficiency comes at the expense of reduced linearity. This is due, at least in part, to the fact that Doherty amplifiers typically employ fixed electrical line lengths and/or phase shift elements to achieve proper phasing between the two signal paths. These fixed line lengths have static phase characteristics associated therewith which vary nonlinearly with frequency. This reduced linearity significantly limits the bandwidth of conventional Doherty amplifiers.

There exists a need, therefore, for a power amplifier having an extended frequency range of operation compared to traditional power amplifiers, which does not suffer from one or more of the problems exhibited by conventional power amplifiers.

SUMMARY OF THE INVENTION

The present invention, in an illustrative embodiment, provides techniques for beneficially extending a usable frequency range of a power amplifier by using one or more thin film ferroelectric phase shift elements in at least one signal path of the amplifier. The use of thin film ferroelectric material is highly linear compared to conventional phase control elements, and furthermore allows tuning of a point at which phase transformation occurs in the power amplifier, thereby providing an extended usable frequency range without any significant reduction in linearity and/or efficiency of the power amplifier.

In accordance with one aspect of the invention, an amplifier includes a signal splitter operable to receive an input signal and generate at least first and second split signals, a first amplifier adapted to receive the first split signal and to generate a first amplified signal, and a second amplifier adapted to receive the second split signal and to generate a second amplified signal. A combining circuit is adapted to generate an output signal which is a sum of the first amplified signal and the second amplified signal. The amplifier further includes a phase control circuit arranged in a signal path of one of the first and second amplifiers, the phase control circuit comprising at least one thin film ferroelectric element. The amount of phase shift provided by the phase control circuit is selectively variable as a function of a control signal applied thereto.

These and other features and advantages of the present invention will become apparent from the following detailed description of illustrative embodiments thereof, which is to be read in connection with the accompanying drawings.

DETAILED DESCRIPTION OF THE INVENTION

The present invention will be described herein in the context of an illustrative Doherty amplifier circuit which may be used, for example, in a power amplifier application. It should be appreciated, however, that the present invention is not limited to the particular amplifier architecture shown, nor are the techniques of the invention limited to any specific application. Rather, the invention is more generally applicable to extending a frequency range of a power amplifier without significantly reducing linearity and/or efficiency in the amplifier, where the term "linearity" as used herein may be defined as the corresponding relationship between an input signal and an output signal such that the output signal is substantially independent of an input signal level. The frequency range of the power amplifier may be extended by utilizing phase control circuitry comprising one or more thin film ferroelectric elements for selectively controlling a phase shift in one or more signal paths of the power amplifier. The term "amplifier" as used herein essentially refers to a circuit for multiplying an input signal applied to the circuit by a predetermined gain which is greater than or equal to one.

Figure 2:
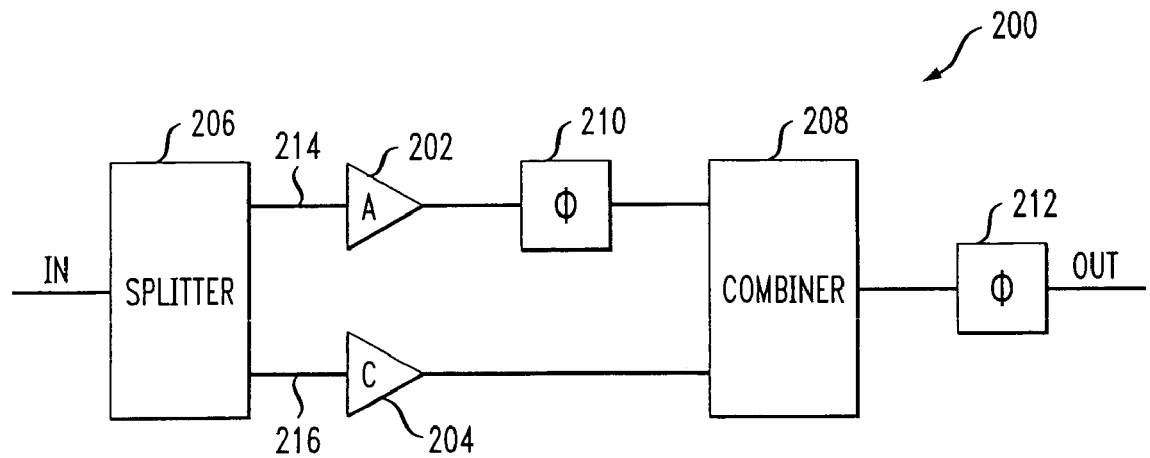
FIG. 2 is a schematic diagram illustrating a Doherty amplifier employing a fixed phase shift circuit.

FIG. 2 is a schematic diagram illustrating a Doherty amplifier 200, in which the techniques of the present invention can be implemented. The Doherty amplifier 200 includes a splitter 206, for dividing an input signal IN presented to the Doherty amplifier into two signals, and first and second amplifiers 202 and 204, respectively. The split signals are provided to respective inputs of the first and second amplifiers 202, 204 via transmission lines 214 and 216, respectively. The first amplifier 202 is biased for class A operation and the second amplifier 204 is biased for class C operation. The Doherty amplifier 200 further includes a first fixed phase shift element 210 connected to an output of the first amplifier 202 for shifting a phase of a first amplified signal generated by the first amplifier by a predetermined amount. The phase-shifted signal generated by the phase shift element 210 in the first signal path is then summed with a second amplified signal generated by the second amplifier 204 in the second signal path by a combiner 208. The combined signal generated by combiner 208 may be passed through a second fixed phase shift element 212 for adjusting a phase and/or impedance matching of an output signal OUT of the Doherty amplifier 200 as desired.

As previously stated, a standard Doherty amplifier employs fixed phase shift elements (e.g., 210, 212) to achieve proper phasing between the two signal paths. These fixed phase shift elements have static phase characteristics associated therewith which vary nonlinearly with frequency. The reduced linearity of the phase shift elements significantly limits a bandwidth of the Doherty amplifier. For this reason, the Doherty amplifier shown in FIG. 2 is preferably modified, in accordance with an embodiment of the invention, by adding phase control circuitry in at least one of the signal paths for selectively controlling an amount of phase shift in the signal path in response to a control signal, as will be described below.

Figure 3:
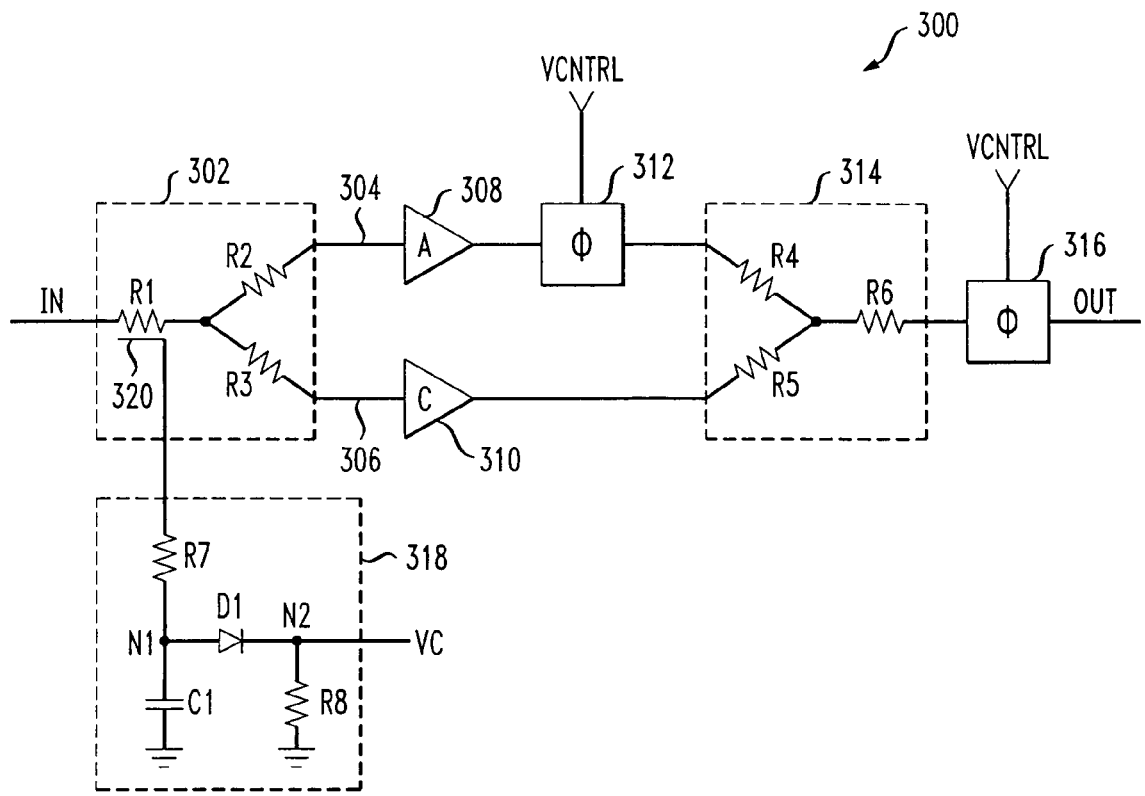
FIG. 3 is a schematic diagram depicting an exemplary power amplifier, formed in accordance with an illustrative embodiment of the present invention.

FIG. 3 is a schematic diagram depicting an exemplary power amplifier 300 in which the techniques of the present invention are implemented, in accordance with an illustrative embodiment thereof. The exemplary power amplifier 300 includes a signal splitter 302, which generates at least two signals from an input signal IN presented to the power amplifier, and at least two amplifiers 308 and 310 capable of operating in different modes. The split signals are provided as respective inputs to the two amplifiers 308, 310, which are coupled through transmission lines 304 and 306, respectively, to the signal splitter 302. With the power amplifier 300 configured as a Doherty amplifier, the first amplifier 308 is preferably biased for class A operation and the second amplifier 310 is biased for class C operation. The present invention similarly contemplates alternative amplifier architectures, such as, but not limited to, a balanced amplifier configuration, in which such biasing arrangement may be modified as desired. For instance, in a balanced amplifier configuration, both the first and second amplifiers 308, 310 are preferably biased for class A operation.

The power amplifier 300 is preferably configured such that as the first amplifier 308 approaches the maximum power it can produce (e.g., just prior to saturation), the output from the second amplifier 310 begins to contribute to the power amplifier output and supplements the power provided by the first amplifier, thereby extending the range of input power over which the power amplifier delivers output power. Additionally, the power supplied by the second amplifier 310 effectively reduces the apparent load impedance seen by the first amplifier 308. This impedance reduction enables the first amplifier 308 to deliver more power to the output, thereby improving the efficiency of the first amplifier.

Figure 1:
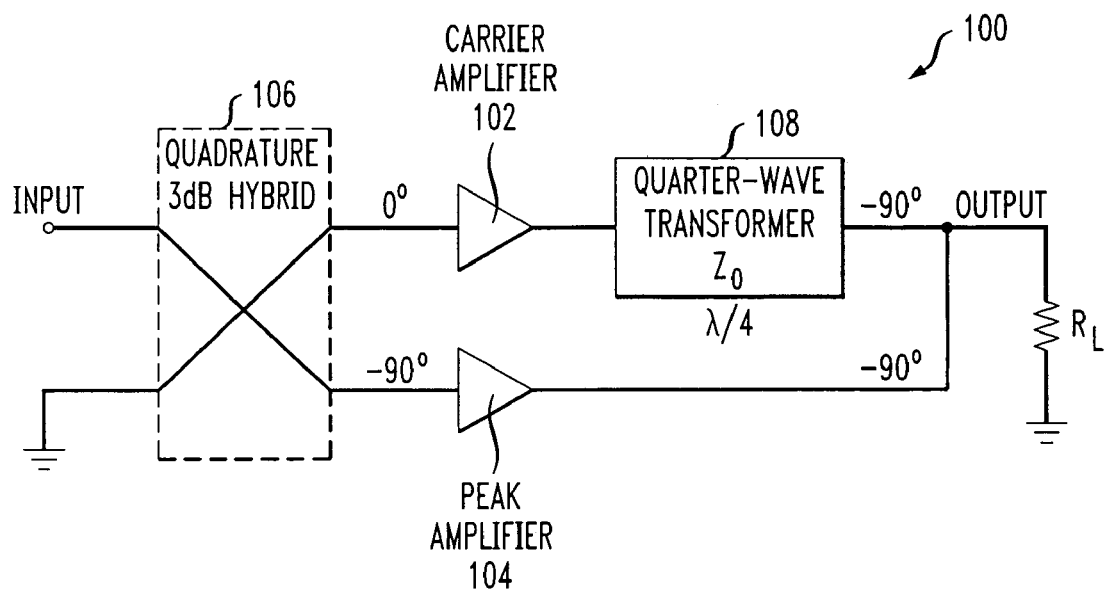
FIG. 1 is a schematic diagram illustrating a conventional Doherty amplifier.

For ease of integration on a silicon chip, signal splitter 302 is preferably an in-phase signal splitter, which may comprise three interconnection elements, such as, for example, resistors R1, R2 and R3, connected in a Y-configuration as shown, although other in-phase power splitting arrangements suitable for use with the present invention are contemplated. Assuming resistors R1, R2 and R3 are of equal value, the input signal IN will be split equally between the two amplifiers 308, 310. In order to minimize signal loss through the signal splitter 302, resistors R1, R2 and R3 may be replaced with substantially zero-ohm elements, such as in a direct connection arrangement. These zero-ohm elements may be fabricated, for example, in metal or polysilicon interconnect layers. Alternatively, signal splitter 302 may be configurable to shift the phase of at least one of the split signals by a selected amount, such as, for example, 90 degrees, as in the case of the quadrature 3-dB hybrid 106 shown in FIG. 1.

The exemplary power amplifier 300 further includes a first phase control circuit 312 coupled to an output of the first amplifier 308. The first phase control circuit 312 is preferably operative to selectively modify a phase of the output signal generated by the first amplifier 308 in response to a control signal VCNTRL applied to the first phase control circuit. A combiner circuit 314 sums the phase-shifted signal generated by the first phase control circuit 312 with the output signal generated by the second amplifier 310. The output signal generated by the combiner circuit 314 can optionally be passed through a second phase control circuit 316 for selectively modifying a phase of the output signal OUT generated by the power amplifier 300 as desired. This may be beneficial, for example, to provide frequency rejection, impedance transformation (e.g., impedance matching), etc., so as to extend a maximum usable frequency range of the power amplifier 300.

For ease of integration on a silicon chip, combiner circuit 314, like signal splitter 302, is preferably an in-phase combiner, which may comprise three resistors R4, R5 and R6 connected in a Y-configuration as shown, although other in-phase combining circuit arrangements suitable for use with the present invention are contemplated. Assuming resistors R4, R5 and R6 are of equal value, the signals from the two signal paths will be summed equally. Alternatively, it is contemplated that the combiner circuit 314 may be configurable to sum the signals in unequal proportions. Moreover, the combiner circuit 314 may be configurable to shift the phase of at least one of the signals by a selected amount, such as, for example, 90 degrees, as in the case of the quarter-wave transformer 108 depicted in FIG. 1.

In accordance with one aspect of the invention, each of the phase control circuits 312, 314 preferably comprises at least one thin film ferroelectric element for selectively varying the phase of an input signal presented to the phase control circuit. In a preferred embodiment of the invention, the thin film ferroelectric element comprises a barium strontium titanate (BST) capacitor, although alternative ferroelectric materials (e.g., lead zirconium titanate, strontium bismuth tantalate, etc.) may be similarly employed, as will be known by those skilled in the art. By applying a bias, it is possible to tune the capacitance value of the BST capacitor, thus varying a phase characteristic of the phase control circuit. BST thin films are particularly well-suited for use in phase control circuitry because of their high tunability, relatively low loss, and fast switching speed compared to standard tunable elements, such as, for example, varactors and pin diodes, which can be highly nonlinear (see, e.g., B. Acikel et al., "High Performance Phase Shifters Using (Ba, Sr)TiO$_3$ Thin Films," *NNUN Abstracts* 2002/*Electronics*, p. 39, the disclosure of which is incorporated by reference herein). In addition, BST thin films are highly insensitive to RF power variations, making them beneficial for use in a power amplifier application.

The exemplary power amplifier 300 preferably includes a frequency detector 318. The frequency detector 318 is adapted for receiving at least a portion of the input signal IN and for generating a frequency-dependent signal VC which is representative of a frequency of the input signal. In an illustrative embodiment of the invention, the frequency detector 318 comprises a resistor R7 connected to node N1 at a first end and receiving at least a portion of the input signal IN at a second end. A capacitor C1 is preferably connected between node N1 and ground. The frequency detector 318 further includes a diode D1 having an anode connected to node N1 and a cathode connected to node N2. A resistor R8 is preferably connected between node N2 and ground. The frequency-dependent signal VC is generated at node N2.

By way of example only, and without loss of generality, the operation of the frequency detector 318 will now be described. An RF signal is preferably tapped off the input of the power amplifier 300, such as through a coupling element 320 in the signal splitter 302. The RF signal is passed through a resistor-capacitor (RC) low pass filter comprised of resistor R7 and capacitor C1. This circuit arrangement is essentially a type of frequency discriminator, in that lower frequencies will pass with less loss while higher frequencies will pass with more loss to node N1. These different levels of RF signal at node N1 are passed through the frequency detector diode D1 to generate a rectified DC current. The rectified DC current will flow through resistor R8, generating an output voltage at node N2 which is a function of the frequency of the input signal. A DC return current path may be provided via the coupling element 320. If a coupling element is used which does not provide a DC return path, a resistor or inductor (not shown) can be added in parallel with capacitor C1. It is to be appreciated that the invention is not limited to the frequency detector shown. Rather, alternative circuitry for generating a frequency-dependent signal may be similarly employed with the exemplary power amplifier 300, as will become apparent to those skilled in the art.

Figure 4:
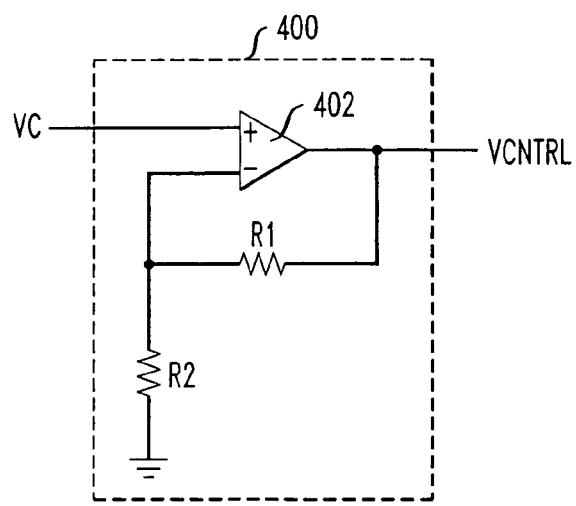
FIG. 4 is a schematic diagram depicting an exemplary phase control signal generator circuit suitable for use with the power amplifier shown in FIG. 3, in accordance with an embodiment of the present invention.

With reference to FIG. 4, the frequency-dependent signal VC is preferably fed to an illustrative processing circuit 400 for generating the control signal VCNTRL which is some function of the input signal frequency. By way of example only, processing circuit 400 may comprise an operational amplifier 402 configured as a noninverting amplifier. The control voltage VCNTRL generated by the processing circuit 400 in this instance will be related to the frequency-dependent signal VC according to the relation VCNTRL=K·VC, where K, which is a gain of the noninverting amplifier, is equal to 1+(R1/R2). It is to be understood that the present invention is not limited to any particular gain and/or circuit arrangement for the processing circuit 400, and that various other circuit arrangements (e.g., an inverting amplifier, etc.) are similarly contemplated.

With reference again to FIG. 3, the second phase control circuit 316, if used, is preferably configured to receive the same control signal VCNTRL as the first phase control circuit 312, although this is not a requirement of the power amplifier 300. The first and second phase control circuits are utilized for different purposes, the first phase control circuit 312 being used to control the phase of the signal generated in the first signal path for summing purposes, and the second phase control circuit 316 being used to control the phase of the output signal OUT for impedance matching purposes. Accordingly, the amount of phase shift generated by each of the first and second phase control circuits need not be the same. An additional processing circuit (not shown) may be included in the power amplifier 300 for generating a second control signal for independently controlling the phase shift of the second phase control circuit 316. The second control signal may be a different function of the frequency of the input signal IN compared to the control signal VCNTRL.

Figure 5:
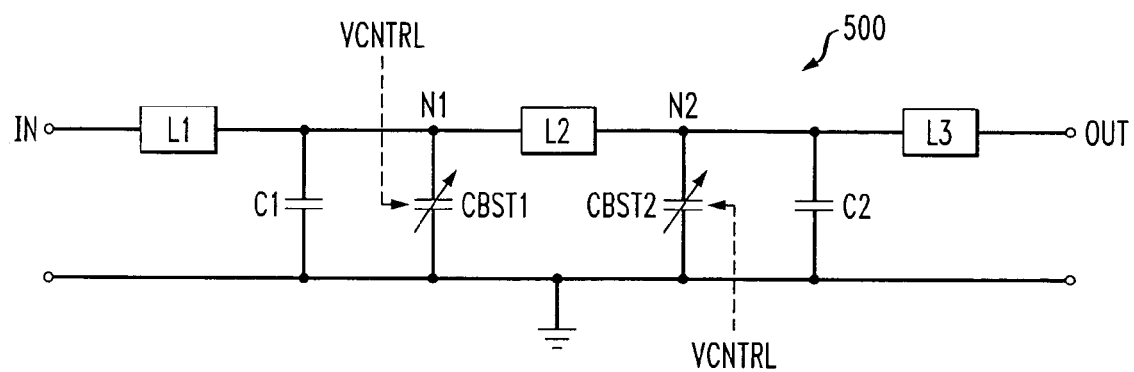
FIG. 5 is a schematic diagram depicting at least a portion of an exemplary phase control circuit suitable for use with the power amplifier shown in FIG. 3, in accordance with an embodiment of the present invention.

FIG. 5 is a schematic diagram illustrating an exemplary phase control circuit 500, formed in accordance with one embodiment of the invention. The exemplary phase control circuit 500 may be employed to implement the first and/or second phase control circuits 312, 316 in the power amplifier 300 shown in FIG. 3. The exemplary phase control circuit 500 comprises a first inductor L1 connected in series between an input node IN and a first node N1, and a first capacitor C1 connected between node N1 and a common node, which may be connected to ground. A first variable capacitor CBST1 is preferably connected in parallel with capacitor C1. The phase control circuit 500 further includes a second inductor L2 connected between node N1 and a second node N2. A second variable capacitor CBST2 is preferably connected between node N2 and the common node. A second capacitor C2 is connected in parallel with the second variable capacitor CBST2, and a third inductor L3 is connected between node N2 and an output node OUT. The two variable capacitors CBST1 and CBST2 are each preferably comprised of a BST thin film, or an alternative ferroelectric thin film material, having a capacitance value that is selectively variable as a function of control signal VCNTRL.

Figure 6:
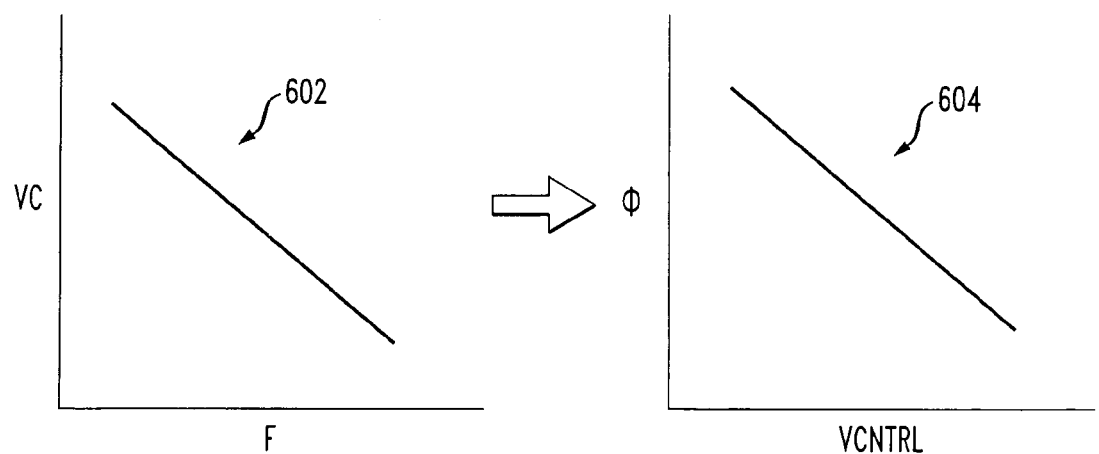
FIG. 6 is a graphical representation illustrating an exemplary voltage verses frequency response and an exemplary phase verses control voltage response for the circuits shown in FIGS. 4 and 5.

As illustrated by the exemplary graphical representations shown in FIG. 6, the relationship 602 between the frequency-dependent voltage VC and frequency F of the input signal is preferably substantially linear, at least over a desired range of input frequencies. By using ferroelectric thin film elements in the phase control circuit(s), this preferably translates into a substantially linear relationship 604 between the amount of phase shift φ generated by the phase control circuit(s) and the control signal VCNTRL applied thereto.

The techniques of the present invention may be employed to provide a power amplifier having a wider frequency range of operation, without a significant reduction in efficiency and/or linearity, compared to conventional power amplifier arrangements. It is to be understood that the present invention is not limited to the specific power amplifier architecture shown. For example, while the exemplary power amplifier 300 depicted in FIG. 3 includes a phase control circuit 312 in the first signal path, an additional phase circuit (not shown) may be included in the second signal path as well, with the amount of phase shift generated by the additional phase control circuit being different than the amount of phase shift generated by phase control circuit 312. Alternative power amplifier configurations are similarly contemplated by the invention, as will become apparent to those skilled in the art.

At least a portion of the power amplifier of the present invention may be implemented in an integrated circuit. In forming integrated circuits, a plurality of identical die are typically fabricated in a repeated pattern on a surface of a semiconductor wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope or spirit of the invention.

What is claimed is:

1. An amplifier, comprising:
   a signal splitter operable to receive an input signal and generate at least first and second split signals;
   a first amplifier adapted to receive the first split signal and to generate a first amplified signal;
   a second amplifier adapted to receive the second split signal and to generate a second amplified signal;
   a combining circuit adapted to generate an output signal which is a sum of the first amplified signal and the second amplified signal; and
   a phase control circuit arranged in a signal path of one of the first or second amplifiers, the amount of phase shift provided by the phase control circuit being selectively variable as a function of a control signal applied thereto, the phase control circuit comprising at least one thin film ferroelectric element;
   wherein the control signal is a function of a frequency of the input signal.

2. The amplifier of claim 1, wherein the phase control circuit follows the first amplifier.

3. The amplifier of claim 1, wherein the phase control circuit precedes the first amplifier.

4. An amplifier, comprising:
   a signal splitter operable to receive an input signal and generate at least first and second split signals;
   a first amplifier adapted to receive the first split signal and to generate a first amplified signal;
   a second amplifier adapted to receive the second split signal and to generate a second amplified signal;
   a combining circuit adapted to generate an output signal which is a sum of the first amplified signal and the second amplified signal; and
   a phase control circuit arranged in a signal path of one of the first and second amplifiers, the amount of phase shift provided by the phase control circuit being selectively variable as a function of a control signal applied thereto, the phase control circuit comprising at least one thin film ferroelectric element;
   wherein the phase control circuit is arranged in the signal path of the first amplifier, and wherein the amplifier further comprises a second phase control circuit arranged in the signal path of the second amplifier, the amount of phase shift provided by the second phase control circuit being selectively variable as a function of a second control signal applied thereto, the second phase control circuit comprising at least one thin film ferroelectric element.

5. The amplifier of claim 4, wherein the amount of phase shift provided by the phase control circuits is substantially the same relative to one another.

6. The amplifier of claim 4, wherein the amount of phase shift provided by the phase control circuits is different relative to one another.

7. A amplifier, comprising:
   a signal splitter operable to receive an input signal and generate at least first and second split signals;
   a first amplifier adapted to receive the first split signal and to generate a first amplified signal;
   a second amplifier adapted to receive the second split signal and to generate a second amplified signal;
   a combining circuit adapted to generate an output signal which is a sum of the first amplified signal and the second amplified signal;
   a phase control circuit arranged in a signal path of one of the first and second amplifiers, the amount of phase shift provided by the phase control circuit being selectively variable as a function of a control signal applied thereto, the phase control circuit comprising at least one thin film ferroelectric element; and
   a frequency detector circuit adapted to receive at least a portion of the input signal and to generate a detector signal that is representative of a frequency of the input signal, the control signal being a function of the detector signal.

8. The amplifier of claim 1, wherein the first amplifier is configured in a class A mode of operation.

9. The amplifier of claim 1, wherein the second amplifier is configured in a class C mode of operation.

10. The amplifier of claim 1, wherein the first and second amplifiers are configured in a class A mode of operation.

11. The amplifier of claim 1, wherein the amplifier is configured as a Doherty amplifier.

12. The amplifier of claim 1, wherein the amplifier is configured as a balanced amplifier.

13. The amplifier of claim 1, wherein the thin film ferroelectric element comprises at least one barium strontium titanate capacitor.

14. An amplifier, comprising:
   a signal splitter operable to receive an input signal and generate at least first and second split signals;
   a first amplifier adapted to receive the first split signal and to generate a first amplified signal;
   a second amplifier adapted to receive the second split signal and to generate a second amplified signal;
   a combining circuit adapted to generate an output signal which is a sum of the first amplified signal and the second amplified signal;
   a phase control circuit arranged in a signal path of one of the first and second amplifiers, the amount of phase shift provided by the phase control circuit being selectively variable as a function of a control signal applied thereto, the phase control circuit comprising at least one thin film ferroelectric element; and a second phase control circuit adapted to receive the output signal and to generate a phase-shifted output signal that is shifted in phase by a desired amount compared to the output signal.

15. An amplifier, comprising:

a signal splitter operable to receive an input signal and generate at least first and second split signals;

a first amplifier adapted to receive the first split signal and to generate a first amplified signal;

a second amplifier adapted to receive the second split signal and to generate a second amplified signal;

a combining circuit adapted to generate an output signal which is a sum of the first amplified signal and the second amplified signal;

a phase control circuit arranged in a signal path of one of the first and second amplifiers, the amount of phase shift provided by the phase control circuit being selectively variable as a function of a control signal applied thereto, the phase control circuit comprising at least one thin film ferroelectric element; and a second phase control circuit adapted to receive the output signal and to generate a phase-shifted output signal that is shifted in phase by a desired amount compared to the output signal, the amount of phase shift of the output signal being selectively variable as a function of a second control signal applied thereto, the second phase control circuit comprising at least one thin film ferroelectric element.

16. The amplifier of claim 1, wherein the signal splitter comprises an in-phase signal splitter operative to split the input signal into at least first and second split signals of substantially equal power.

17. The amplifier of claim 1, wherein the combining circuit comprises an in-phase combining circuit.

18. An amplifier, comprising:

a signal splitter operable to receive an input signal and generate at least first and second split signals;

a first amplifier adapted to receive the first split signal and to generate a first amplified signal;

a second amplifier adapted to receive the second split signal and to generate a second amplified signal;

a combining circuit adapted to generate an output signal which is a sum of the first amplified signal and the second amplified signal; and at least one phase control circuit arranged in a signal path of one of the first and second amplifiers, the amount of phase shift provided by the phase control circuit being selectively variable as a function of a control signal applied thereto, the phase control circuit comprising at least one thin film ferroelectric element;

wherein the at least one phase control circuit comprises:

a first inductor connected in series between an input node and a first node of the phase control circuit;

a first capacitor connected between the first node and a common node;

a first variable capacitor connected in parallel with the first capacitor;

a second inductor connected between the first node and a second node;

a second variable capacitor connected between the second node and the common node;

a second capacitor connected in parallel with the second variable capacitor; and a third inductor connected between the second node and an output node.

19. The amplifier of claim 1, wherein the control signal is a substantially linear function of a frequency of the input signal.

20. An amplifier, comprising:

a signal splitter operable to receive an input signal and generate at least first and second split signals;

a first amplifier adapted to receive the first split signal and to generate a first amplified signal;

a second amplifier adapted to receive the second split signal and to generate a second amplified signal;

a combining circuit adapted to generate an output signal which is a sum of the first amplified signal and the second amplified signal; and a phase control circuit arranged in a signal path of one of the first and second amplifiers, the amount of phase shift provided by the phase control circuit being selectively variable as a function of a control signal applied thereto, the control signal being a function of a frequency of the input signal, the phase control circuit comprising at least one thin film ferroelectric element;

wherein the signal splitter comprises a first interconnection element connected between an input of the power amplifier and a first node the input signal being applied to the input of the power amplifier, a second interconnection element connected between the first node and a second node, the first split signal being generated at the second node, and a third interconnection element connected between the first node and a third node, the second split signal being generated at the third node.

21. An integrated circuit including at least one amplifier, the at least one amplifier comprising:

a signal splitter operable to receive an input signal and generate at least first and second split signals;

a first amplifier adapted to receive the first split signal and to generate a first amplified signal;

a second amplifier adapted to receive the second split signal and to generate a second amplified signal;

a combining circuit adapted to generate an output signal which is a sum of the first amplified signal and the second amplified signal; and a phase control circuit arranged in a signal path of one of the first or second amplifiers, the amount of phase shift provided by the phase control circuit being selectively variable as a function of a control signal applied thereto, the phase control circuit comprising at least one thin film ferroelectric element;

wherein the control signal is a function of a frequency of the input signal.

* * * * *